(12) United States Patent
Joo

(10) Patent No.: US 11,070,349 B1
(45) Date of Patent: Jul. 20, 2021

(54) CLOCK AND DATA RECOVERY CIRCUIT AND RECEPTION DEVICE HAVING THE SAME

(71) Applicant: SAMSUNG ELECTRONICS CO., LTD., Suwon-si (KR)

(72) Inventor: Hyeyoon Joo, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/031,360

(22) Filed: Sep. 24, 2020

(30) Foreign Application Priority Data

May 18, 2020 (KR) .......................... 10-2020-0059034

(51) Int. Cl.
*H04L 7/00* (2006.01)
*H04L 25/03* (2006.01)

(52) U.S. Cl.
CPC ...... *H04L 7/0016* (2013.01); *H04L 25/03057* (2013.01)

(58) Field of Classification Search
CPC .......................... H04L 7/0016; H04L 25/03292
See application file for complete search history.

(56) References Cited

U.S. PATENT DOCUMENTS

| | | | | |
|---|---|---|---|---|
| 7,254,345 B2 * | 8/2007 | Suzuki | ................. | H04B 10/695 398/202 |
| 7,489,749 B2 * | 2/2009 | Liu | ......................... | H04L 7/007 375/348 |
| 7,697,649 B2 * | 4/2010 | Okamura | .......... | H04L 25/03006 375/355 |
| 8,249,447 B2 * | 8/2012 | Cai | ...................... | H04B 10/695 398/24 |
| 8,442,104 B2 * | 5/2013 | Takeda | .................... | H04L 27/01 375/232 |
| 10,466,301 B1 * | 11/2019 | Lee | ..................... | G01R 31/3171 |
| 2003/0002575 A1 * | 1/2003 | Agazzi | ........... | G01R 31/318594 375/233 |
| 2003/0043440 A1 * | 3/2003 | Suzaki | ................. | H04B 10/695 398/202 |
| 2003/0058930 A1 * | 3/2003 | Sawada | ............ | G11B 20/10046 375/233 |
| 2005/0185742 A1 * | 8/2005 | Liu | ......................... | H04L 7/007 375/348 |

(Continued)

FOREIGN PATENT DOCUMENTS

KR 10-0892683 B1 4/2009

*Primary Examiner* — Qutbuddin Ghulamali
(74) *Attorney, Agent, or Firm* — Sughrue Mion, PLLC

(57) ABSTRACT

A clock and data recovery circuit includes an equalizer configured to equalize an input signal to generate an equalization input signal, a subtractor configured to subtract a decision feedback equalization signal from the equalization input signal to generate a sampling input signal, a decision feedback equalization unit configured to generate first digital data corresponding to the sampling input signal in response to a first sampling clock signal, generate second digital data corresponding to the sampling input signal in response to a second sampling clock signal having a predetermined time difference with the first sampling clock signal, and compare the sampling input signal and a reference data level. A controller is configured to adjust the reference data level, determine a maximum eye opening and adjust a sample timing based on the reference data level.

20 Claims, 11 Drawing Sheets

(56) References Cited

U.S. PATENT DOCUMENTS

| | | | |
|---|---|---|---|
| 2006/0256849 A1* | 11/2006 | Tseng | H04L 25/0307 375/232 |
| 2007/0047680 A1* | 3/2007 | Okamura | H04L 25/03885 375/348 |
| 2009/0269076 A1* | 10/2009 | Cai | H04B 10/695 398/135 |
| 2010/0303143 A1* | 12/2010 | Takeda | H04L 27/01 375/232 |
| 2016/0294537 A1* | 10/2016 | Hoshyar | H04L 25/03267 |
| 2017/0099132 A1* | 4/2017 | Lee | G06Q 10/06312 |

* cited by examiner

| LD | RD | LDE | RDE | code | w1~wn | RDL |
|----|----|-----|-----|------|-------|-----|
| 0 | 0 | 0 | 0 |  | update | DN |
| 0 | 0 | 0 | 1 | DN |  |  |
| 0 | 0 | 1 | 0 | UP |  |  |
| 0 | 0 | 1 | 1 |  | update | UP |
| 0 | 1 | 0 | 0 |  |  |  |
| 0 | 1 | 0 | 1 | DN |  |  |
| 0 | 1 | 1 | 0 | UP |  |  |
| 0 | 1 | 1 | 1 |  |  |  |
| 1 | 0 | 0 | 0 |  |  |  |
| 1 | 0 | 0 | 1 | DN |  |  |
| 1 | 0 | 1 | 0 | UP |  |  |
| 1 | 0 | 1 | 1 |  |  |  |
| 1 | 1 | 0 | 0 |  | update | DN |
| 1 | 1 | 0 | 1 | DN |  |  |
| 1 | 1 | 1 | 0 | UP |  |  |
| 1 | 1 | 1 | 1 |  | update | UP |

CLOCK AND DATA RECOVERY CIRCUIT AND RECEPTION DEVICE HAVING THE SAME

CROSS-REFERENCE TO THE RELATED APPLICATION

This application claims priority from Korean Patent Application No. 10-2020-0059034, filed on May 18, 2020, in the Korean Intellectual Property Office, the disclosure of which is incorporated herein by reference in its entirety.

BACKGROUND

1. Field

Example embodiments of the disclosure relate to a clock and data recovery circuit and a reception device having the same.

2. Description of the Related Art

Data transmitted from a transmission device is delayed and is distorted when the data is transmitted to a reception device through a channel, and thus the data received by the reception device is not digital data but an analog signal.

A clock and data recovery (CDR) circuit is included in the reception device, and receive the analog signal transmitted from the transmission device to generate a sampling clock signal at an optimal timing for recovering the digital data and generate recovered data. The optimal timing may be a timing in which an eye opening of the analog signal is maximized.

However, it is not easy for the CDR circuit to generate the sampling clock signal at the optimal timing due to intersymbol interference (ISI) between adjacent symbols of the analog signal, for example, re-cursor ISI.

SUMMARY

Example embodiments of the disclosure provide a clock and data recovery circuit capable of generating a sampling clock signal at an optimal timing by considering pre-cursor intersymbol interference to generate recovered data, and a reception device having the same.

Aspects of embodiments of the disclosure are not limited to the aforementioned aspect, and other unmentioned aspects will be clearly understood by those skilled in the art based on the following description.

According to an aspect of an example embodiment, there is provided a clock and data recovery circuit including—an equalizer configured to equalize an input signal to generate an equalization input signal; a subtractor configured to subtract a decision feedback equalization signal from the equalization input signal to generate a sampling input signal; a decision feedback equalization unit configured to: generate first digital data corresponding to the sampling input signal in response to a first sampling clock signal, generate second digital data corresponding to the sampling input signal in response to a second sampling clock signal having a predetermined time difference with the first sampling clock signal, compare the sampling input signal and a reference data level to generate first error data in response to the first sampling clock signal, compare the sampling input signal and the reference data level to generate second error data in response to the second sampling clock signal, and generate the decision feedback equalization signal by multiplying at least one decision feedback equalization coefficient with previous first digital data of the first digital data; a clock signal generator configured to generate the first sampling clock signal and the second sampling clock signal according to a code value; and a controller configured to vary at least one of the reference data level or the code value based on the first digital data, the second digital data, the first error data, and the second error data.

According to an aspect of an example embodiment, there is provided a clock and data recovery circuit including: an equalizer configured to equalize an input signal to generate an equalization input signal; a subtractor configured to subtract a decision feedback equalization signal from the equalization input signal to generate a sampling input signal; a decision feedback equalization unit configured to: generate first digital data corresponding to the sampling input signal in response to a first sampling clock signal, generate second digital data corresponding to the sampling input signal in response to a second sampling clock signal having a predetermined time difference with the first sampling clock signal, compare the sampling input signal and a reference data level to generate first error data in response to the first sampling clock signal, compare the sampling input signal and the reference data level to generate second error data in response to the second sampling clock signal, and generate the decision feedback equalization signal by multiplying at least one decision feedback equalization coefficient with corresponding previous first digital data of the first digital data; a clock signal generator configured to generate the first sampling clock signal and the second sampling clock signal according to a code value; and a controller configured to vary at least one of the reference data level, the code value, or the at least one decision feedback equalization coefficient based on the first digital data, the second digital data, the first error data, and the second error data.

According to an aspect of an example embodiment, there is provided a reception device including: a clock and data recovery circuit configured to receive an input single to generate recovered data, wherein the clock and data recovery circuit includes: an equalizer configured to equalize an input signal to generate an equalization input signal; a subtractor configured to subtract a decision feedback equalization signal from the equalization input signal to generate a sampling input signal; a decision feedback equalization unit configured to: generate first digital data corresponding to the sampling input signal in response to a first sampling clock signal, generate second digital data corresponding to the sampling input signal in response to a second sampling clock signal having a predetermined time difference with the first sampling clock signal, compare the sampling input signal and a reference data level to generate first error data in response to the first sampling clock signal, compare the sampling input signal and the reference data level to generate second error data in response to the second sampling clock signal, and generate the decision feedback equalization signal by multiplying at least one decision feedback equalization coefficient with corresponding previous first digital data of the first digital data; a clock signal generator configured to generate the first sampling clock signal and the second sampling clock signal according to a code value; and a controller configured to vary the reference data level or the code value based on the first digital data, the second digital data, the first error data, and the second error data.

BRIEF DESCRIPTION OF THE DRAWINGS

The above and other aspects will become apparent by describing in detail example embodiments with reference to the accompanying drawings, in which.

DETAILED DESCRIPTION

Hereinafter, a clock and data recovery circuit and a reception device having the same according to example embodiments will be described with reference to the accompanying drawings.

Figure 1:
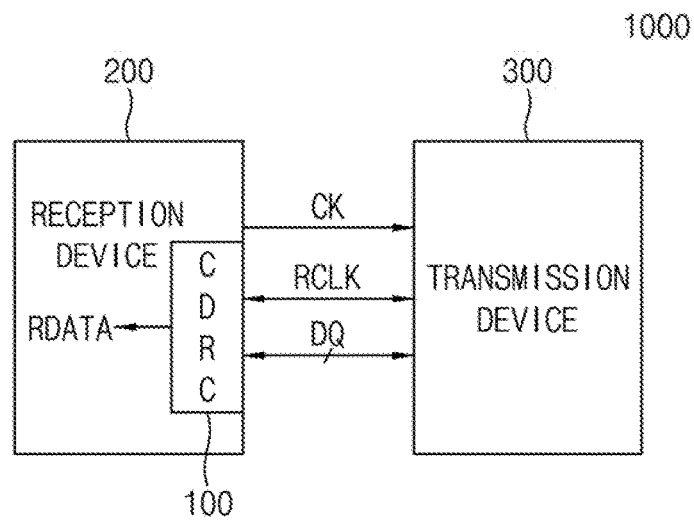
FIG. 1 is a block diagram illustrating a configuration of a transceiver system according to an example embodiment.

FIG. 1 is a block diagram illustrating a configuration of a transceiver system according to an example embodiment. The transceiver system 1000 may include a reception device 200 and a transmission device 300, and the reception device 200 may include a clock and data recovery circuit (CDRC) 100.

Referring to FIG. 1, the reception device 200 may transmit a clock signal CK and data DQ, and receive a reference clock signal RCK and data DQ. The transmission device 300 may transmit the reference clock signal RCK and the data DQ.

The clock and data recovery circuit 100 may receive the reference clock signal RCLK and the data DQ to generate a sampling clock signal at an optimal timing for recovering the data DQ and generate recovered data RDATA.

In FIG. 1, the reference clock signal RCLK may not be transmitted.

As an example embodiment, the transmission device 300 may be a semiconductor memory device, and the reception device 200 may be a control unit, for example, a central processing unit (CPU), a graphic processing unit (GPU), and the like.

Figure 2:
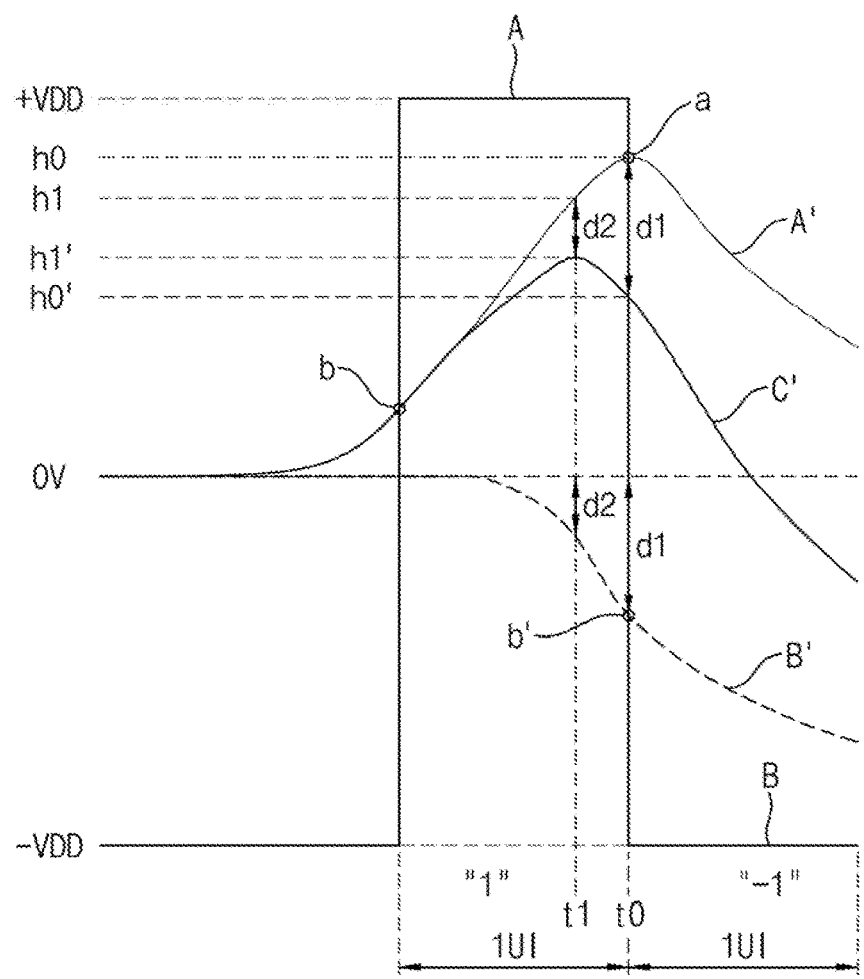
FIG. 2 is a diagram illustrating waveforms of data transmitted from a transmission device and input signals received at a reception device a according to an example embodiment.

FIG. 2 is a diagram illustrating waveforms of data A and B transmitted from the transmission device 300 and input signals A' and B' received at the reception device 200. FIG. 2 illustrates waveforms of the analog input signals A' and B' received at the reception device 200 when the transmission device 300 transmits positive data A (digital data A of "1") and negative data B (digital data B of "0") at 1 unit interval (1UI) using a non-return to zero (NRZ) method. Unlike shown in FIG. 2, each of the data A and B and the input signals A' and B' may be a differential data pair and a differential input signal pair. Further, in FIG. 2, a represents a main-cursor of the input signal A', b represents a pre-cursor of the input signal A', and b' represents a pre-cursor of the input signal B'. FIG. 2 illustrates a waveform in which there is one pre-cursor in each of the input signals A' and B'.

Referring to FIG. 2, when considering only the input signal A' corresponding to the positive data A without considering the negative data B, a maximum eye height h0 may be at a timing t0. However, when the input signal A' corresponding to the positive data A overlaps the input signal B' corresponding to the negative data B, that is, when pre-cursor ISI between a symbol shown as the input signal A' and a symbol shown as the input signal B' occurs, an eye height of the input signal A' may be decreased by d1 from h0 to h0' at the timing t0, and an eye height of the input signal A' may be decreased by d2 from h1 to h1' at a first timing t1. That is, an eye height h1' of a curve C' which can be obtained by adding the input signal A' and the input signal B' may be a maximum eye height of the input signal A', and an eye opening of the input signal A' may be maximized at not the timing t0 but the first timing t1.

Referring to FIGS. 1 and 2, the clock and data recovery circuit 100 may receive the reference clock signal RCLK and the data DQ, and perform a tracking operation for tracking the first timing t1 which is an optimal timing in which an eye opening becomes maximized. The tracking operation may be performed during an initialization operation at power-up, and continuously operate in response to changes in temperature, noise, or the like, during a normal operation.

Figure 3:
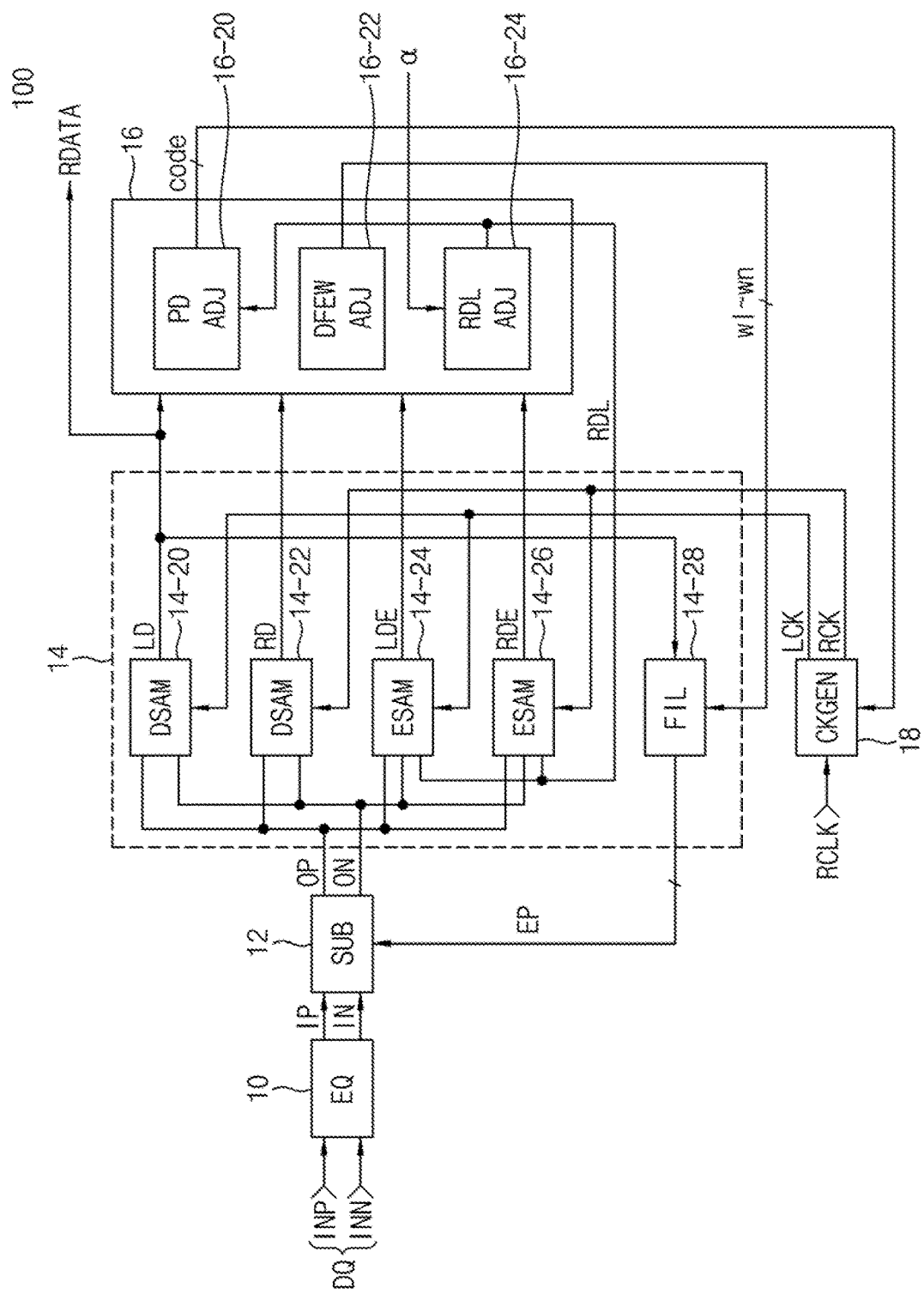
FIG. 3 is a block diagram illustrating a configuration of a clock and data recovery circuit according to an example embodiment.

FIG. 3 is a block diagram illustrating a configuration of the clock and data recovery circuit 100 according to an example embodiment. The clock and data recovery circuit 100 may include an equalizer (EQ) 10, a subtractor (SUB) 12, a decision feedback equalization unit 14, a controller 16, and a clock signal generator (CKGEN) 18. The decision feedback equalization unit 14 may include a first data sampler (DSAM) 14-20, a second data sampler DSAM 14-22, a first error sampler (ESAM) 14-24, a second error sampler (ESAM) 14-26, and a feedback filter (FIL) 14-28. The controller 16 may include a phase adjuster (PD ADJ) 16-20, a decision feedback equalization coefficient adjuster (DFEW ADJ) 16-22, and a reference data level adjuster (RDL ADJ) 16-24.

A function of each of the blocks shown in FIG. 3 will be described below.

The equalizer 10 may equalize an input signal corresponding to data DQ, for example, a differential input pair INP and INN, to generate an equalized input signal pair IP and IN. For example, the equalizer 10 may be a well-known continuous time linear equalizer (CTLE).

The subtractor 12 may subtract the decision feedback equalization signal EP from the equalized input signal, for example, the equalized input signal pair IP and IN, to generate a sampling input signal, for example, a sampling input signal pair OP and ON.

The decision feedback equalization unit 14 may generate first digital data LD corresponding to the sampling input signal, for example, the sampling input signal pair OP and ON in response to a first sampling clock signal LCK, generate second digital data RD corresponding to the sampling input signal in response to a second sampling clock signal RCK having a predetermined time difference with the first sampling clock signal LCK, compare the sampling input signal and a reference data level RDL to generate first error data LDE in response to the first sampling clock signal LCK, compare the sampling input signal and the reference data level RDL to generate second error data RDE in response to the second sampling clock signal RCL, and multiply a decision feedback equalization coefficient, for example, n equalization coefficients w1 to wn, to previous first digital data of the first digital data LD to generate a decision feedback equalization signal.

The first data sampler 14-20 may amplify a difference of the sampling input signal, for example, the sampling input signal pair OP and ON, to generate the first digital data LD in response to the first sampling clock signal LCK. That is, the first data sampler 14-20 may generate the first digital data LD of "1" when the sampling input signal is greater than a reference voltage, for example, 0V, and generate the first digital data LD of "0" when the sampling input signal is smaller than the reference voltage.

The second data sampler 14-22 may amplify a difference of the sampling input signal, for example, the sampling input signal pair OP and ON, to generate the second digital data RD in response to the second sampling clock signal RCK. That is, the second data sampler 14-22 may generate the second digital data RD of "1" when the sampling input signal is greater than the reference voltage, for example, 0V, and generate the second digital data RD of "0" when the sampling input signal is smaller than the reference voltage. The second sampling clock signal RCK may have the predetermined time difference with the first sampling clock signal LCK.

The first error sampler 14-24 may compare the sampling input signal, for example, the sampling input signal pair OP and ON, and the reference data level RDL to generate first error data LDE in response to the first sampling clock signal LCK. That is, the first error sampler 14-24 may generate the first error data LDE of "1" when the sampling input signal OP is greater than the reference data level RDL, and generate the first error data LDE of "0" when the sampling input signal OP is smaller than the reference data level RDL. In some embodiments, the first error data LDE depends only on OP and does not depend on ON.

The second error sampler 14-26 may compare the sampling input signal, for example, the sampling input signal pair OP and ON, and the reference data level RDL to generate second error data RDE in response to the second sampling clock signal RCK. That is, the second error sampler 14-26 may generate the second error data RDE of "1" when the sampling input signal OP is greater than the reference data level RDL, and generate the second error data RDE of "0" when the sampling input signal OP is smaller than the reference data level RDL. In some example embodiments, the second error data RDE depends only on OP and does not depend on ON.

The feedback filter 14-28 may add n signals obtained by multiplying the decision feedback equalization coefficient, for example, n equalization coefficients w1 to wn, to the previous first digital data of the first digital data LD, for example, first to $n^{th}$ previous first digital data to generate a decision feedback equalization signal EP.

The controller 16 may adjust the reference data level RDL, a code value code, or the decision feedback equalization coefficient, for example, the n equalization coefficients w1 to wn, based on the first digital data LD, the second digital data RD, the first error data LDE, and the second error data RDE.

The phase adjuster 16-20 may change the code value code when the first error data LDE and the second error data RDE are different from each other.

The decision feedback equalization coefficient adjuster 16-22 may change the decision feedback equalization coefficient, for example, the n equalization coefficients w1 to wn, when the first digital data LD and the second digital data RD are the same and the first error data LDE and the second error data RDE are the same.

The reference data level adjuster 16-24 may change the reference data level RDL when the first digital data LD and the second digital data RD are the same and the first error data LDE and the second error data RDE are the same.

Figures 4, 5:
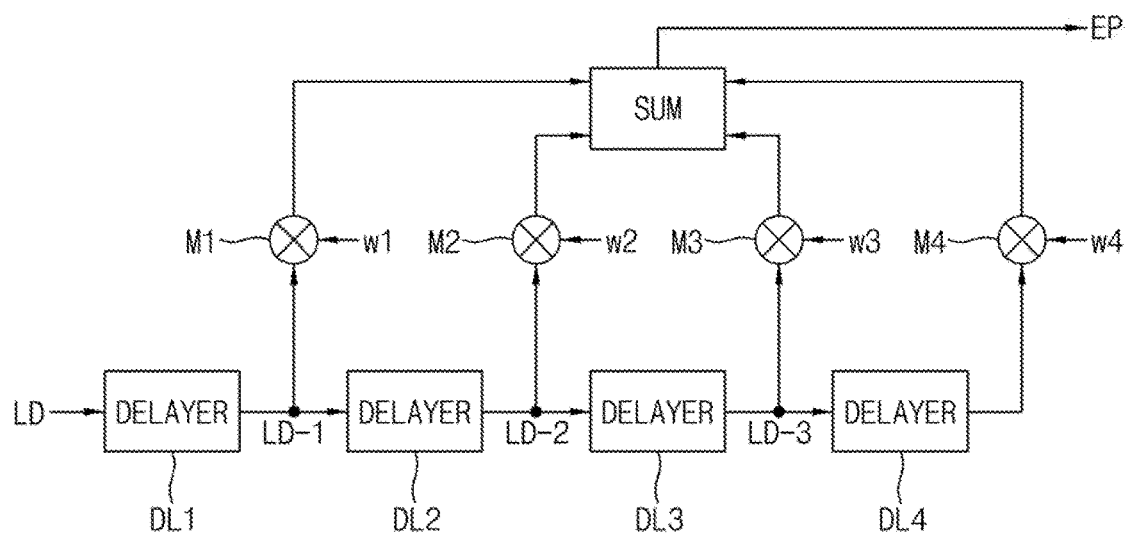
FIG. 4 is a table for describing an operation of a phase adjuster, a decision feedback equalization coefficient adjuster, and a reference data level adjuster according to an example embodiment.
FIG. 5 is a diagram illustrating a configuration of a feedback filter according to an example embodiment.

FIG. 4 is a table for describing an operation of the phase adjuster 16-20, the decision feedback equalization coefficient adjuster 16-22, and the reference data level adjuster 16-24 according to an example embodiment.

Referring to FIG. 4, the phase adjuster 16-20 may increase (UP) phases of the first sampling clock signal LCK and the second sampling clock signal RCK by decreasing the code value code by a first value when the first error data LDE is greater than the second error data RDE regardless of the first digital data LD and the second digital data RD, and may decrease (DN) phases of the first sampling clock signal LCK and the second sampling clock signal RCK by increasing the code value code by a second value when the first error data LDE is smaller than the second error data RDE regardless of the first digital data LD and the second digital data RD. The first value may be equal to the second value.

The decision feedback equalization coefficient adjuster 16-22 may update the decision feedback equalization coefficient, for example, the n equalization coefficients w1 to wn, when all of the first digital data LD, the second digital data RD, the first error data LDE, and the second error data RDE are "0" or "1", both the first digital data LD and the second digital data RD are "0" and both the first error data LDE and the second error data RDE are "1", or both the first digital data LD and the second digital data RD are "1" and both the first error data LDE and the second error data RDE are "0". The n equalization coefficients w1 to wn may be equalization coefficients for the first previous first digital data to the $n^{th}$ previous first digital data, respectively. For example, the decision feedback equalization coefficient adjuster 16-22 may increase each of the n equalization coefficients w1 to wn when both the first error data LDE and the second error data RDE are "1" and each of the first previous first digital data to the $n^{th}$ previous first digital data is "1" or the first error data LDE and the second error data RDE are "4" and each of the first previous first digital data to the n previous first digital data is "0", and on the other hand, may decrease each of the n equalization coefficients w1 to wn when both the first error data LDE and the second error data RDE are "1" and each of the first previous first digital data to the $n^{th}$ previous first digital data is "0" or the first error data LDE and the second error data RDE are "0" and each of the first previous first digital data to the n previous first digital data is "1".

The reference data level adjuster 16-24 may decrease the reference data level RDL when all of the first digital data ID, the second digital data RD, the first error data LDE, and the second error data RDE are "0", or both the first digital data LD and the second digital data RD are "1" and both the first error data LDE and the second error data RDE are "0", and may increase the reference data level RDL when all of the first digital data LD, the second digital data RD, the first error data LDE, and the second error data RDE are "1", or both the first digital data LD and the second digital data RD are "0" and both the first error data LDE and the second error data RDE are "1". The reference data level adjuster 16-24 may increase the reference data level RDL by a first level, for example, a predetermined unit level ds when increasing the reference data level RDL, and may decrease the reference data level RDL by a second level, for example, $\alpha(=2^{(k+1)}-1) \times ds$ when decreasing the reference data level RDL. Here, k is the number of pre-cursors of the input signal INP. For example, when the number of pre-cursors of the input signal INP is 0, the reference data level adjuster 16-24 may increase the reference data level RDL by the first level, for example, ds, and may decrease the reference data level RDL by the second level, for example, ds. When the number of pre-cursors of the input signal INP is 1, the reference data level adjuster 16-24 may increase the reference data level RDL by the first level, for example, ds, and may decrease the reference data level RDL by the second level, for example, 3×ds. When the number of pre-cursors of the input signal INP is 2, the reference data level adjuster 16-24 may increase the reference data level RDL by the first level, for example, ds, and may decrease the reference data level RDL by the second level, for example, 7×ds.

In FIG. 4, when the first digital data LD, the second digital data RD, the first error data LDE, and the second error data RDE is "0100" or "1011", the controller 16 may not change the code value code, the reference data level RDL, or the n equalization coefficients w1 to wn.

FIG. 5 is a diagram illustrating a configuration of the feedback filter 14-28 according to an example embodiment. The feedback filter 14-28 may include first to fourth delayer DL1 to DL4, first to fourth multipliers M1 to M4, and an adder SUM.

Figure 6:
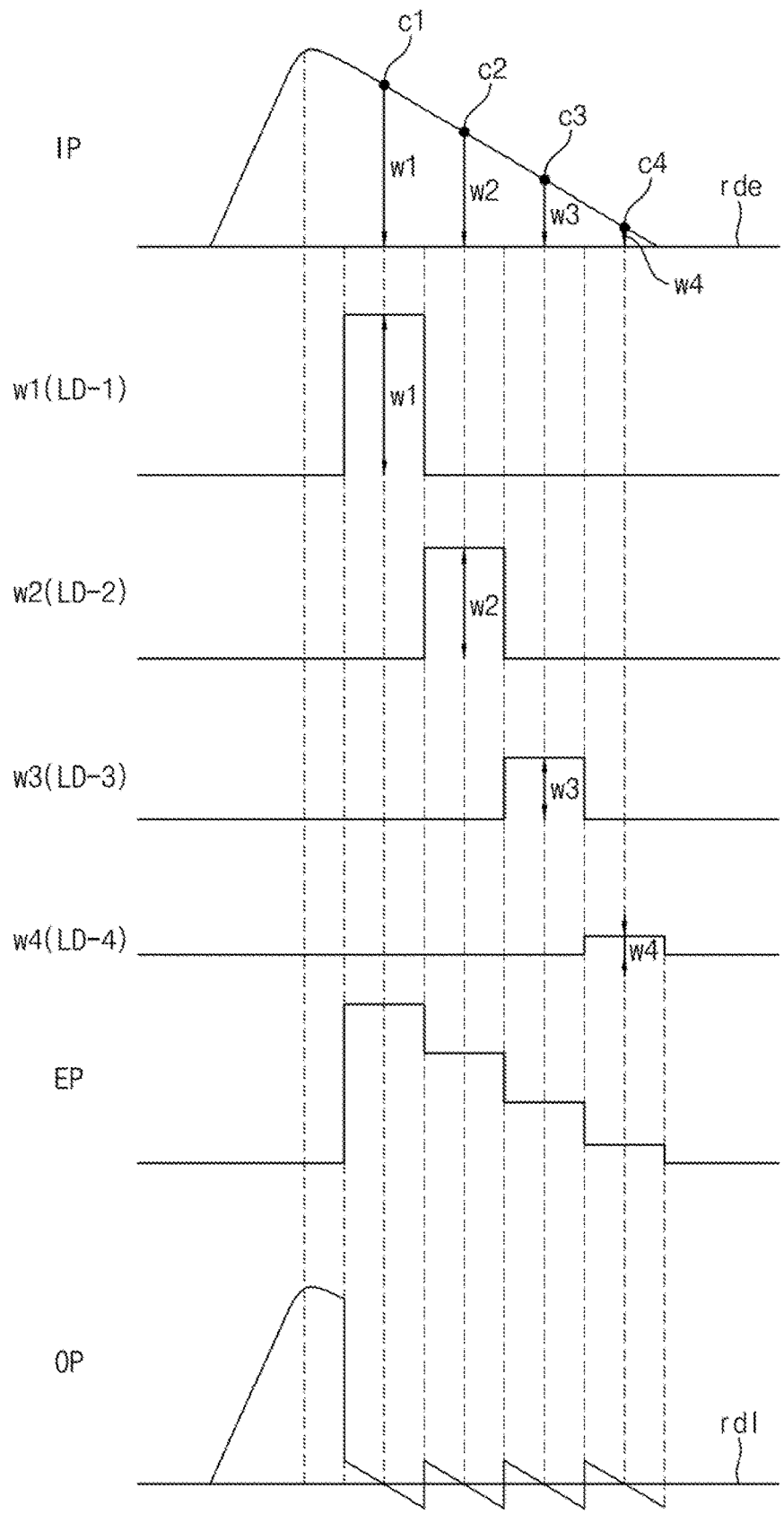
FIG. 6 is a waveform diagram for describing an operation of the feedback filter according to an example embodiment.

FIG. 6 is a waveform diagram for describing an operation of the feedback filter 14-28 according to an example embodiment. For example, in a case that, when data DQ of "010000" is transmitted from the transmission device 300 shown in FIG. 1, the equalization input signal IP having 4 post-cursors c1, c2, c3 and c4 are generated, the first digital data LD is "010000", and 4 equalization coefficients w1 to w4 are set to w1>w2>w3>w4, waveforms of 4 signals (w1×(LD−1), w2×(LD−2), w3×(LD−3), w4×(LD−4)) generated from the first to fourth multipliers M1 to M4 are illustrated.

Referring to FIGS. 5 and 6, an operation of each of blocks shown in FIG. 5 will be described below.

The first delayer DL1 may delay the first digital data LD of "1" (not shown) by a predetermined time, for example, 1 unit interval (UI), to generate the first previous first digital data LD−1.

The first multiplier M1 may multiply the equalization coefficient w1 to the first previous first digital data LD−1 of "1" to generate a signal w1×(LD−1). That is, the signal w1×(LD−1) may have a signal having a amplitude corresponding to the equalization coefficient w1.

The second delayer DL2 may delay the first previous first digital data LD−1 by the predetermined time, for example, UI, to generate second previous first digital data LD−2.

The second multiplier M2 may multiply the equalization coefficient w2 to the second previous first digital data LD−2 of "1" to generate a signal w2×(LD−2). That is, the signal w2×(LD−2) may have a signal having amplitude corresponding to the equalization coefficient w2.

The third delayer DL3 may delay the second previous first digital data LD−2 of "1" by the predetermined time, for example, 1UI, to generate third previous first digital data LD−3.

The third multiplier M3 may multiply the equalization coefficient w3 to the third previous first digital data LD−3 of "1" to generate a signal w3×(LD−3). That is, the signal w3×(LD−3) may have a signal having amplitude corresponding to the equalization coefficient w3.

The fourth delayer DL4 may delay the third previous first digital data LD−3 of "1" by the predetermined time, for example, 1UI, to generate fourth previous first digital data LD−4.

The fourth multiplier M3 may multiply the equalization coefficient w4 to the fourth previous first digital data LD−4 of "1" to generate a signal w4×(LD−4). That is, the signal w4×(LD−4) may have a signal having the amplitude corresponding to the equalization coefficient w4.

The adder SUM may add the signals w1×(LD−1), w2×(LD−2), w3×(LD−3), and w4×(LD−4) to generate the decision feedback equalization signal EP.

Each of the first to fourth delayers DL1 to DL4 may be a flop-flop operating in response to the first sampling clock signal LCK.

The subtractor 12 shown in FIG. 3 may subtract the decision feedback equalization signal EP from the equalization input signal IP to generate the sampling input signal OP. The 4 post-cursors of the equalization input signal IP may be decreased by a predetermined level rdl by the feedback filter 14-28 shown in FIG. 5. The predetermined level rdl may be 0V or the reference data level RDL. As the number of delayers of the feedback filter 14-28 shown in FIG. 5 is increased, the post-cursor ISI may be sufficiently and efficiently removed, and also the pre-cursor ISS may be efficiently removed.

Figure 7:
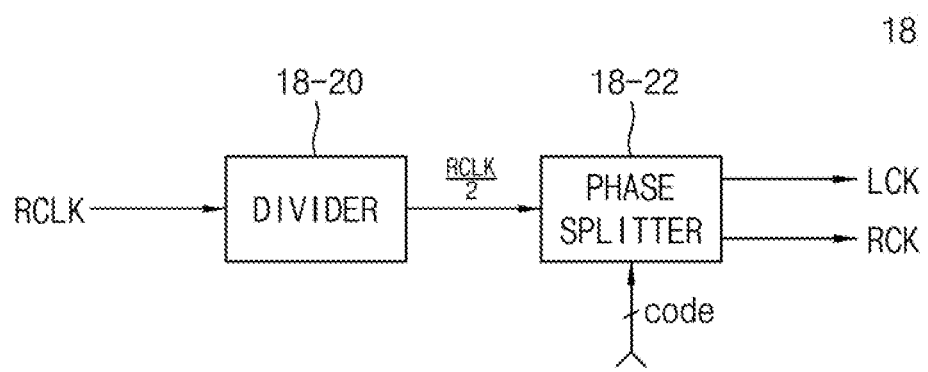
FIG. 7 is a diagram illustrating a configuration of a clock signal generator according to an example embodiment.
Figure 8:
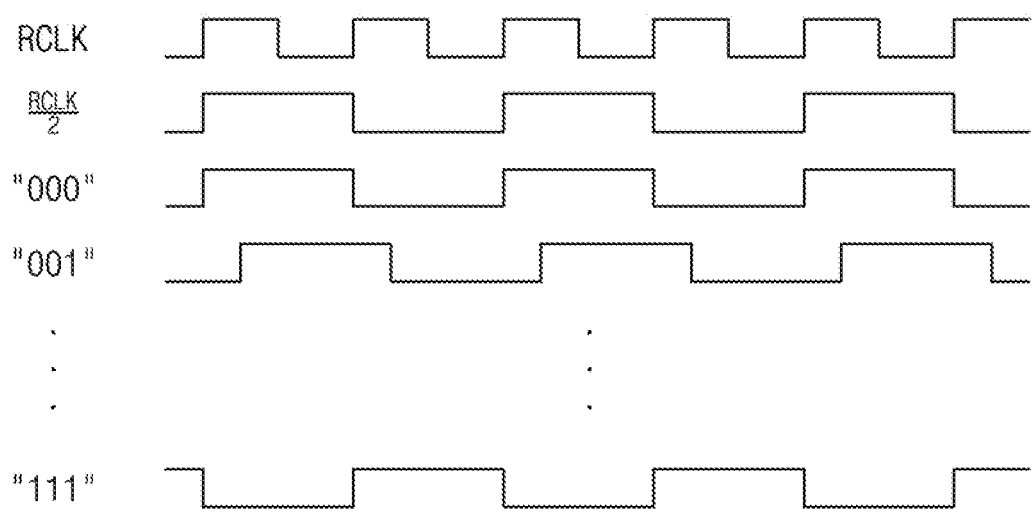
FIG. 8 is an operation timing diagram for describing an operation of the clock signal generator according to an example embodiment.

Referring to FIGS. 5 and 6, since each of the first previous first digital data LD−1 to the fourth previous first digital data LD−4 is "1" when both the first error data LDE and the second error data RDE are "1", the decision feedback equalization coefficient adjuster 16-22 shown in FIG. 3 may increase each of the 4 equalization coefficients w1 to w4, and since each of the first previous first digital data LD−1 to the fourth previous first digital data LD−4 is "1" when both the first error data LDE and the second error data RDE are "0", the decision feedback equalization coefficient adjuster 16-22 shown in FIG. 3 may decrease each of the 4 equalization coefficients w1 to w4, FIG. 7 is a diagram illustrating a configuration of the clock signal generator 18 according to an example embodiment, and FIG. 8 is an operation timing diagram for describing an operation of the clock signal generator 18. The clock signal generator 18 may include a divider 18-20 and a phase splitter 18-22.

Referring to FIGS. 7 and 8, the divider 18-20 may divide the reference clock signal RCLK to generate a divided clock signal RCLK/2 having a frequency of ½ of the reference clock signal RCLK. The phase splitter 18-22 may split a phase of the divided clock signal RCLK/2 to generate a plurality of splitted clock signals, for example, 8 splitted clock signals, and select one among the 8 splitted clock signals in response to the code value code, for example, a 3-bit code value code, to generate the first sampling clock signal LCK, and generate the second sampling clock signal RCK delayed by the predetermined time from the first sampling clock signal LCK. The phase splitter 18-22 may be configured to generate 16 splitted clock signals, and generate two clock signals among the 16 splitted clock signals as the first sampling clock signal LCK and the second sampling clock signal RCK.

Figure 9A:
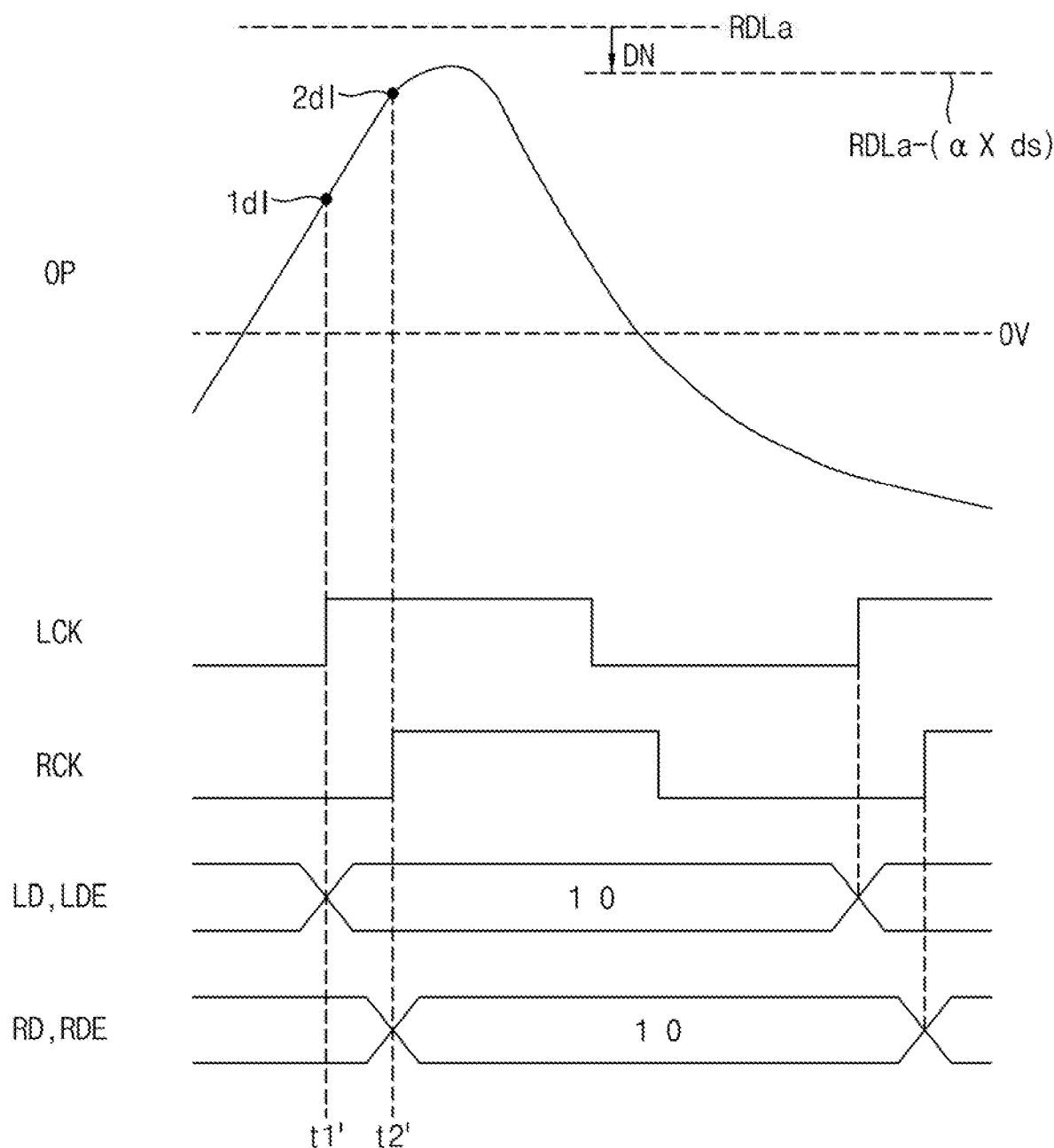
FIGS. 9A, 9B and 9C and FIGS. 10A, 10B, and 10C are operation timing diagrams for describing an operation of a controller according to example embodiments.
Figure 9B:
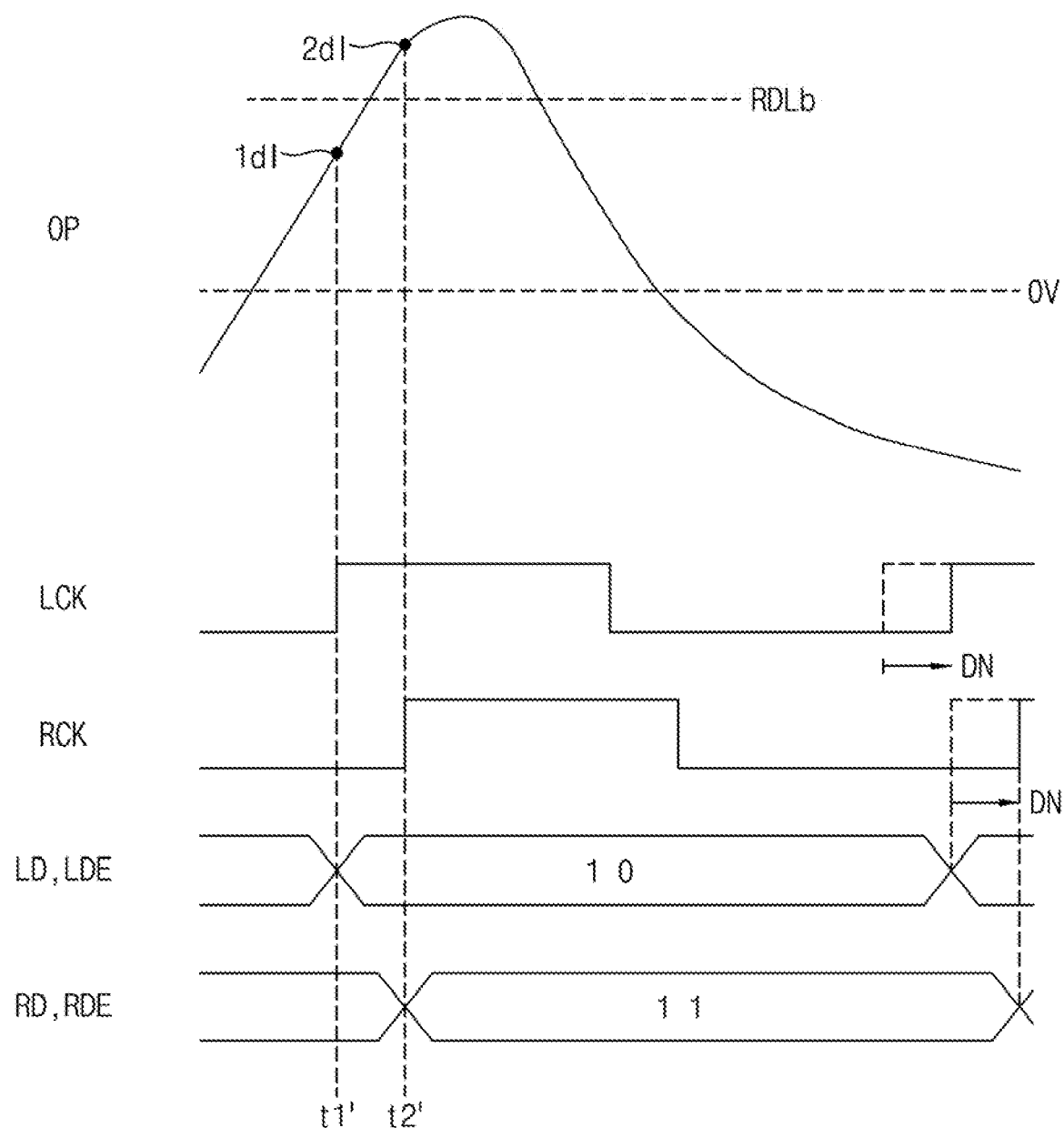
Figure 9C:
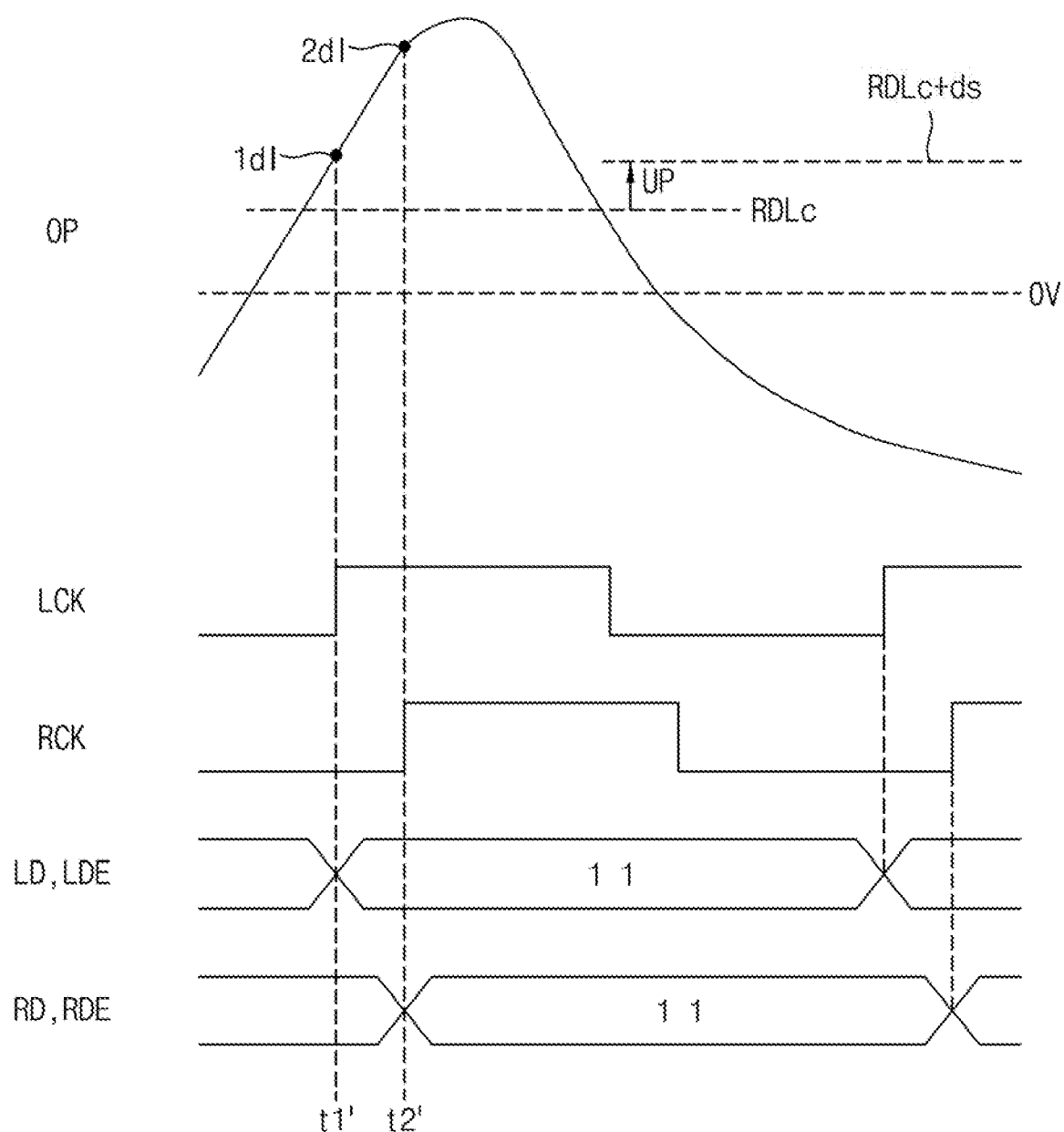

FIGS. 9A to 9C are operation timing diagrams for describing an operation of the controller 16 according to an example embodiment. FIGS. 9A to 9C are operation timing diagrams for describing a tracking operation of the controller 16 in a case that a level 1dl of the input signal OP at a first timing t1' is smaller than a level 2dl of the input signal OP at a second timing t2', and the reference data level RDL is RDLa.

RDLb, or RDLc. In FIGS. 9A to 9C, the input signal OP may be a signal in which the post-cursor ISI is not removed.

An operation of a case that the reference data level RDL is RDLa will be described below with reference to FIGS. 1 to 9A.

The first data sampler 14-20 may generate the first digital data LD of "1" corresponding to the level 1dl in response to the first sampling clock signal LCK, and the first error sampler 14-24 may generate the first error data LDE of "0" since the level 1dl is smaller than RDLa in response to the first sampling clock signal LCK. The second data sampler 14-22 may generate the second digital data RD of "1" corresponding to the level 2dl in response to the second sampling clock signal RCL, and the second error sampler 14-26 may generate the second error data RDE of "0" since the level 2dl is smaller than RDLa in response to the second sampling clock signal RCK. In this case, the controller 16 may decrease (DN) the reference data level RDL by the second level αxds from RDLa. In addition, the controller 16 may update the decision feedback equalization coefficient.

An operation of a case that the reference data level RDL is RDLb will be described below with reference to FIGS. 1 to 9B.

The first data sampler 14-20 may generate the first digital data LD of "1", and the first error sampler 14-24 may generate the first error data LDE of "0". The second data sampler 14-22 may generate the second digital data RD of "1", and the second error sampler 14-26 may generate the second error data RDE of "1" since the level 2dl is greater than RDLb in response to the second sampling clock signal RCK. In this case, the controller 16 may increase the code value code to decrease (DN) phases of the first sampling clock signal LCK and the second sampling clock signal RCK.

An operation of a case that the reference data level RDL is RDLc will be described with reference to FIGS. 1 to 9C.

The first data sampler 14-20 may generate the first digital data LD of "1", and the first error sampler 14-24 may generate the first error data LDE of "1". The second data sampler 14-22 may generate the second digital data RD of "1", and the second error sampler 14-26 may generate the second error data RDE of "1". In this case, the controller 16 may increase (UP) the reference data level RDL by the first level ds from RDLc. In addition, the controller 16 may update the decision feedback equalization coefficient.

Figure 10A:
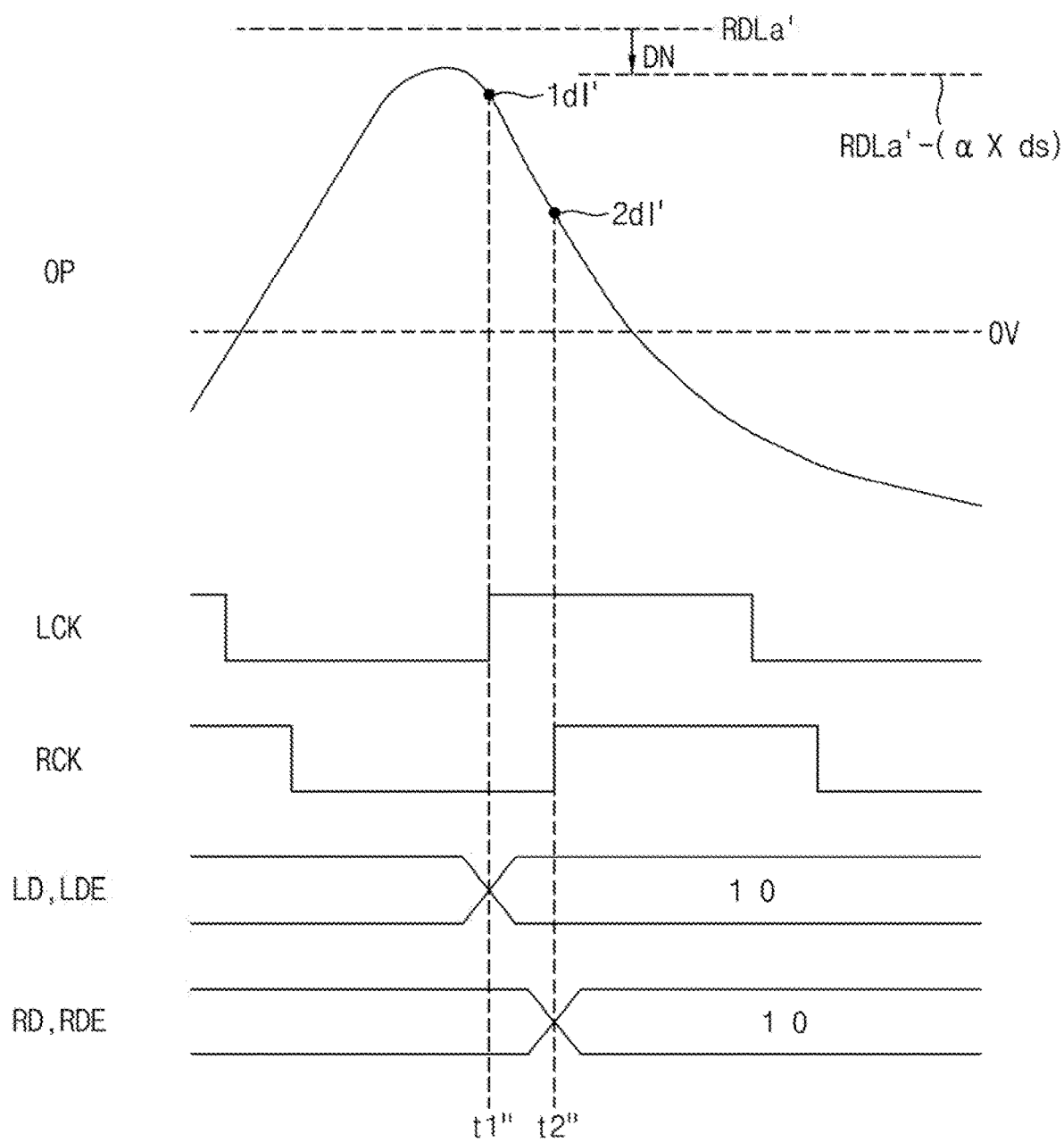
Figure 10B:
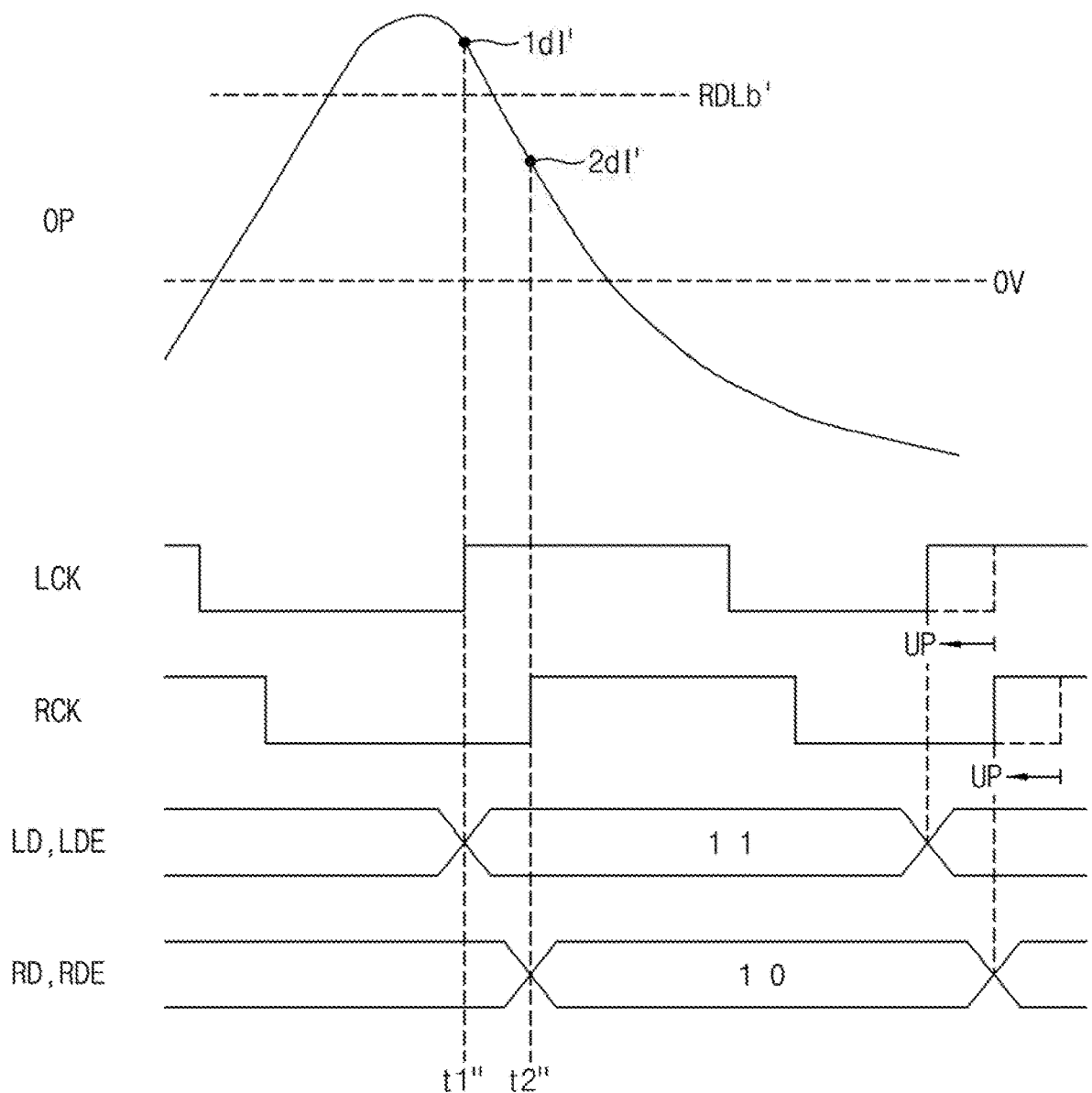
Figure 10C:
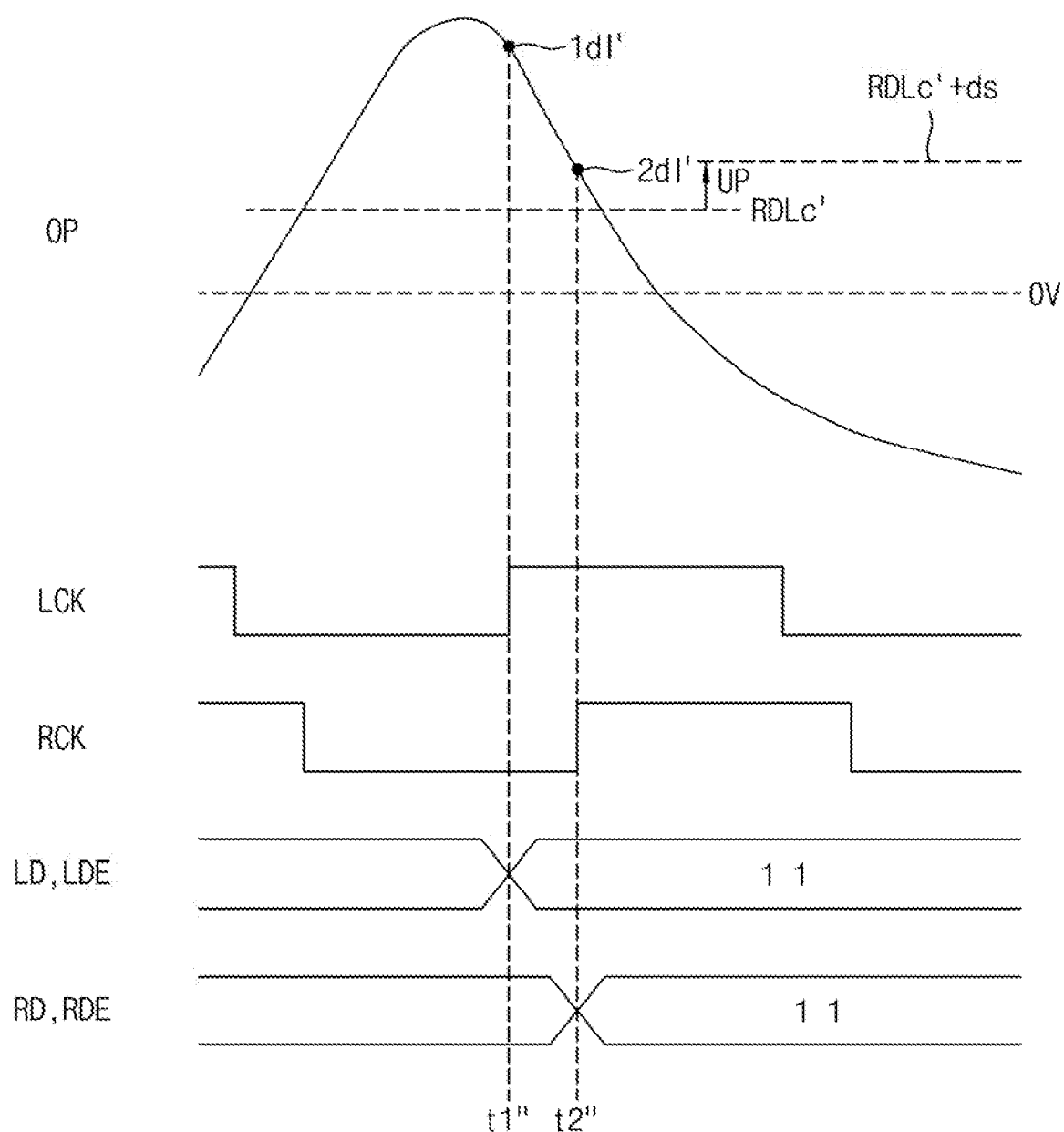

FIGS. 10A, 10B and 10C are operation timing diagrams for describing an operation of the controller 16 according to an example embodiment. FIGS. 10A to 10C are operation timing diagrams for describing a tracking operation of the controller 16 in a case that a level 1dl' of the input signal OP at a first timing t1" is greater than a level 2dl' of the input signal OP at a second timing t2", and the reference data level RDL is RDLa', RDLb', or RDLc'. In FIGS. 10A to 10C, the input signal OP may be a signal in which the post-cursor ISI is not removed.

An operation of a case that the reference data level RDL is RDLa' will be described with reference to FIGS. 1 to 8 and 10A.

The first data sampler 14-20 may generate the first digital data LD of "1", and the first error sampler 14-24 may generate the first error data LDE of "0". The second data sampler 14-22 may generate the second digital data RD of "1", and the second error sampler 14-26 may generate the second error data RDE of "0". In this case, the controller 16 may decrease (DN) the reference data level RDL by the second level αxds from RDLa'. In addition, the controller 16 may update the decision feedback equalization coefficient.

An operation of a case that the reference data level RDL is RDLb' will be described with reference to FIGS. 1 to 8 and 10B.

The first data sampler 14-20 may generate the first digital data LD of "1", and the first error sampler 14-24 may generate the first error data LDE of "1". The second data sampler 14-22 may generate the second digital data RD of "1", and the second error sampler 14-26 may generate the second error data RDE of "0". In this case, the controller 16 may decrease the code value code to increase (UP) phases of the first sampling clock signal LCK and the second sampling clock signal RCK.

An operation of a case that the reference data level RDL is RDLc' will be described with reference to FIGS. 1 to 8 and 10C.

The first data sampler 14-20 may generate the first digital data LD of "1" and the first error sampler 14-24 may generate the first error data LDE of "1". The second data sampler 14-22 may generate the second digital data RD of "1", and the second error sampler 14-26 may generate the second error data RDE of "1". In this case, the controller 16 may increase (UP) the reference data level RDL by the first level ds from RDLc'. In addition, the controller 16 may update the decision feedback equalization coefficient.

According to example embodiments, the controller 16 may adjust the code value code, the reference data level RDL, or the decision feedback equalization coefficient using the first digital data LD, the second digital data RD, the first error data LDE, and the second error data RDE to generate the first sampling clock signal LCK at an optimal timing in which the eye opening is maximized by considering the pre-cursor ISI.

According to example embodiments, the clock and data recovery circuit may generate the sampling clock signal at the optimal timing by considering the pre-cursor ISI to generate the recovered data.

Further, according to example embodiments, the clock and data recovery circuit may adjust the reference data level and the phase of the sampling clock signal using the first digital value ("0"/"1") and/or the second digital value ("1"/"0") of the two digital data and the two error data obtained at two timings, and thus the configuration thereof may be simplified.

Accordingly, operation reliability of the clock and data recovery circuit and the reception device having the same may be improved.

While the disclosure has been particularly shown and described with reference to example embodiments thereof, it will be apparent to those skilled in the art that various changes in form and detail may be made without departing from the spirit and essential characteristics of the disclosure. The above embodiments are therefore to be construed in all aspects as illustrative and not restrictive.

What is claimed is:

1. A clock and data recovery circuit comprising:
   an equalizer configured to equalize an input signal to generate an equalization input signal;
   a subtractor configured to subtract a decision feedback equalization signal from the equalization input signal to generate a sampling input signal;
   a decision feedback equalization unit configured to:
   generate first digital data corresponding to the sampling input signal in response to a first sampling clock signal,
   generate second digital data corresponding to the sampling input signal in response to a second sampling clock signal having a predetermined time difference with the first sampling clock signal, compare the sampling input signal and a reference data level to generate first error data in response to the first sampling clock signal, compare the sampling input signal and the reference data level to generate second error data in response to the second sampling clock signal, and generate the decision feedback equalization signal by multiplying at least one decision feedback equalization coefficient with previous first digital data of the first digital data;

a clock signal generator configured to generate the first sampling clock signal and the second sampling clock signal according to a code value; and a controller configured to vary at least one of the reference data level or the code value based on the first digital data, the second digital data, the first error data, and the second error data.

2. The clock and data recovery circuit according to claim 1, wherein the decision feedback equalization unit comprises:

a first sampler configured to sample a level of the sampling input signal to generate the first digital data in response to the first sampling clock signal;

a second sampler configured to sample the level of the sampling input signal to generate the second digital data in response to the second sampling clock signal;

a third sampler configured to compare the sampling input signal and the reference data level to generate the first error data in response to the first sampling clock signal;

a fourth sampler configured to compare the sampling input signal and the reference data level to generate the second error data in response to the second sampling clock signal; and a feedback filter configured to multiply the at least one decision feedback equalization coefficient with corresponding previous first digital data to generate the decision feedback equalization signal.

3. The clock and data recovery circuit according to claim 2, wherein the controller comprises:

a phase adjuster configured to adjust the code value based on the first error data and the second error data being different from each other; and a reference data level adjuster configured to adjust the reference data level based on the first digital data and the second digital data being the same and the first error data and the second error data being the same.

4. The clock and data recovery circuit according to claim 3, wherein the phase adjuster is configured to:

decrease the code value by a first value based on the first error data being greater than the second error data, and increase the code value by a second value based on the first error data being smaller than the second error data, and wherein the first value is equal to the second value.

5. The clock and data recovery circuit according to claim 3, wherein the reference data level adjuster is further configured to:

decrease the reference data level by a first predetermined level based on all of the first digital data, the second digital data, the first error data, and the second error data being a first digital value or based on both the first digital data and the second digital data being a second digital value and both the first error data and the second error data being the first digital value, and increase the reference data level by a second predetermined level based in all of the first digital data, the second digital data, the first error data, and the second error data being the second digital value or based on both of the first digital data and the second digital data being the first digital value and both the first error data and the second error data being the second digital value.

6. The clock and data recovery circuit according to claim 5, wherein a ratio of weight values of the first predetermined level and the second predetermined level is $2^{k+1}-1:1$, and k is the number of pre-cursors of the input signal.

7. The clock and data recovery circuit according to claim 3, wherein the controller further comprises:

a decision feedback equalization coefficient adjuster configured to adjust the at least one decision feedback equalization coefficient based on the first digital data and the second digital data being the same and the first error data and the second error data being the same.

8. The clock and data recovery circuit according to claim 7, wherein there are n previous first digital data and the at least one decision feedback equalization coefficient comprises n decision feedback equalization coefficients, and the feedback filter comprises:

n delayers which are connected in series, and configured to delay the first digital data to generate first to $n^{th}$ previous first digital data; and a multiplier and adder configured to multiply each of the n decision feedback equalization coefficients by the first to $n^{th}$ previous first digital data, respectively, to generate n signals, and add the n signals to generate the decision feedback equalization signal.

9. The clock and data recovery circuit according to claim 7, wherein the decision feedback equalization coefficient adjuster is configured to update the at least one decision feedback equalization coefficient based on all of the first digital data, the second digital data, the first error data and the second error data being a first digital value or a second digital value, based on both of the first digital data and the second digital data being the first digital value, and both the first error data and the second error data being the second digital value, or based on both of the first digital data and the second digital data being the second digital value and both of the first error data and the second error data being the first digital value.

10. The clock and data recovery circuit according to claim 1, wherein the clock signal generator comprises:

a divider configured to divide a reference clock signal to generate a divided clock signal; and a phase splitter configure to generate a plurality of phase-split clock signals using the divided clock signal, and generate one among the plurality of phase-split clock signals as the first sampling clock signal and another one among the plurality of phase-split clock signals as the second sampling clock signal according to the code value.

11. A clock and data recovery circuit comprising:

an equalizer configured to equalize an input signal to generate an equalization input signal;

a subtractor configured to subtract a decision feedback equalization signal from the equalization input signal to generate a sampling input signal;

a decision feedback equalization unit configured to:

generate first digital data corresponding to the sampling input signal in response to a first sampling clock signal, generate second digital data corresponding to the sampling input signal in response to a second sampling clock signal having a predetermined time difference with the first sampling clock signal, compare the sampling input signal and a reference data level to generate first error data in response to the first sampling clock signal, compare the sampling input signal and the reference data level to generate second error data in response to the second sampling clock signal, and generate the decision feedback equalization signal by multiplying at least one decision feedback equalization coefficient with corresponding previous first digital data of the first digital data;

a clock signal generator configured to generate the first sampling clock signal and the second sampling clock signal according to a code value; and a controller configured to vary at least one of the reference data level, the code value, or the at least one decision feedback equalization coefficient based on the first digital data, the second digital data, the first error data, and the second error data.

12. The clock and data recovery circuit according to claim 11, wherein the decision feedback equalization unit comprises:

a first data sampler configured to sample a level of the sampling input signal to generate the first digital data in response to the first sampling clock signal;

a second data sampler configured to sample the level of the sampling input signal to generate the second digital data in response to the second sampling clock signal;

a first error sampler configured to compare the sampling input signal and the reference data level to generate the first error data in response to the first sampling clock signal;

a second error sampler configured to compare the sampling input signal and the reference data level to generate the second error data in response to the second sampling clock signal; and a feedback filter configured to generate the decision feedback equalization signal.

13. The clock and data recovery circuit according to claim 12, wherein the controller comprises:

a phase adjuster configured to adjust the code value based on the first error data and the second error data being different from each other;

a decision feedback equalization coefficient adjuster configured to adjust the at least one decision feedback equalization coefficient based on the first digital data and the second digital data being the same and the first error data and the second error data being the same; and a reference data level adjuster configured to adjust the reference data level based on the first digital data and the second digital data being the same and the first error data and the second error data being the same.

14. A reception device comprising:

a clock and data recovery circuit configured to receive an input single to generate recovered data, wherein the clock and data recovery circuit comprises:

an equalizer configured to equalize an input signal to generate an equalization input signal;

a subtractor configured to subtract a decision feedback equalization signal from the equalization input signal to generate a sampling input signal;

a decision feedback equalization unit configured to:

generate first digital data corresponding to the sampling input signal in response to a first sampling clock signal, generate second digital data corresponding to the sampling input signal in response to a second sampling clock signal having a predetermined time difference with the first sampling clock signal, compare the sampling input signal and a reference data level to generate first error data in response to the first sampling clock signal, compare the sampling input signal and the reference data level to generate second error data in response to the second sampling clock signal, and generate the decision feedback equalization signal by multiplying at least one decision feedback equalization coefficient with corresponding previous first digital data of the first digital data;

a clock signal generator configured to generate the first sampling clock signal and the second sampling clock signal according to a code value; and a controller configured to vary the reference data level or the code value based on the first digital data, the second digital data, the first error data, and the second error data.

15. The reception device according to claim 14, wherein the decision feedback equalization unit comprises:

a first sampler configured to sample a level of the sampling input signal to generate the first digital data based on the first sampling clock signal;

a second sampler configured to sample the level of the sampling input signal to generate the second digital data based on the second sampling clock signal;

a third sampler configured to compare the sampling input signal and the reference data level to generate the first error data based on the first sampling clock signal;

a fourth sampler configured to compare the sampling input signal and the reference data level to generate the second error data based on the second sampling clock signal; and a feedback filter configured to generate the decision feedback equalization signal.

16. The reception device according to claim 15, wherein the controller comprises:

a phase adjuster configured to adjust the code value based on the first error data and the second error data being different from each other; and a reference data level adjuster configured to adjust the reference data level based on the first digital data and the second digital data being the same and the first error data and the second error data being the same.

17. The reception device according to claim 16, wherein the phase adjuster is further configured to:

decrease the code value by a first value based on the first error data being greater than the second error data, and increase the code value by a second value based on the first error data being smaller than the second error data, and wherein the first value is equal to the second value.

18. The reception device according to claim 16, wherein the reference data level adjuster is configured to:

decrease the reference data level by a first predetermined level based on all of the first digital data, the second digital data, the first error data, and the second error data being a first digital value or based on both the first digital data and the second digital data being a second digital value and both the first error data and the second error data being the first digital value, and increase the reference data level by a second predetermined level based on all of the first digital data, the second digital data, the first error data, and the second error data being the second digital value or based on both of the first digital data and the second digital data being the first digital value and both the first error data and the second error data being the second digital value, and wherein a ratio of weight values of the first predetermined level and the second predetermined level is $2^{k+1}-1:1$, and k is the number of pre-cursors of the input signal.

19. The reception device according to claim 16, wherein the controller further comprises:

a decision feedback equalization coefficient adjuster configured to adjust the at least one decision feedback equalization coefficient based on the first digital data and the second digital data being the same and the first error data and the second error data being the same.

20. The reception device according to claim 19, wherein there are n previous first digital data and the at least one decision feedback equalization coefficient comprises n decision feedback equalization coefficients, and wherein the feedback filter comprises:

n delayers which are connected in series, and configured to delay the first digital data to generate first to $n^{th}$ previous first digital data; and a multiplier and adder configured to multiply each the n decision feedback equalization coefficients by the corresponding first to $n^{th}$ previous first digital data to generate n signals, and add the n signals to generate the at least one decision feedback equalization coefficient, and wherein the decision feedback equalization coefficient adjuster is configured to update the at least one decision feedback equalization coefficient based on all of the first digital data, the second digital data, the first error data and the second error data being a first digital value or a second digital value, based on both of the first digital data and the second digital data being the first digital value and both the first error data and the second error data being the second digital value, or based on both of the first digital data and the second digital data being the second digital value and both of the first error data and the second error data being the first digital value.

* * * * *